United States Patent [19]

Toya et al.

[11] Patent Number: 5,200,157
[45] Date of Patent: Apr. 6, 1993

[54] SUSCEPTOR FOR VAPOR-GROWTH DEPOSITION

[75] Inventors: Eiichi Toya; Masayuki Ohkawa; Kazuo Itoh; Yasumi Sasaki, all of Yamagata, Japan

[73] Assignee: Toshiba Ceramics Co., Ltd., Tokyo, Japan

[21] Appl. No.: 668,329

[22] Filed: Mar. 14, 1991

Related U.S. Application Data

[63] Continuation of Ser. No. 551,646, Jul. 9, 1990, abandoned, which is a continuation of Ser. No. 232,553, Aug. 15, 1988, abandoned, which is a continuation-in-part of Ser. No. 13,432, Feb. 11, 1987, abandoned.

[30] Foreign Application Priority Data

Feb. 17, 1986 [JP] Japan .................................. 61-32223

[51] Int. Cl.⁵ .............................................. C30B 25/12
[52] U.S. Cl. .................................... 422/246; 422/245; 156/610; 156/613; 156/614; 156/DIG. 64; 123/345; 118/728
[58] Field of Search ....... 156/610, 613, 614, DIG. 64; 422/245, 246; 423/345

[56] References Cited

U.S. PATENT DOCUMENTS

| | | | |
|---|---|---|---|
| 3,205,043 | 9/1965 | Taylor | 423/345 |
| 3,382,113 | 5/1968 | Ebert et al. | 156/614 |
| 3,463,666 | 8/1969 | Kern et al. | 156/613 |
| 3,520,740 | 7/1970 | Addamiano | 156/614 |
| 4,623,425 | 11/1986 | Suzuki et al. | 156/613 |
| 4,624,735 | 11/1986 | Kayana et al. | 423/345 |

FOREIGN PATENT DOCUMENTS

| | | | |
|---|---|---|---|
| 2322952 | 5/1973 | Fed. Rep. of Germany | 156/610 |
| 54-104488 | 8/1979 | Japan | 156/DIG. 64 |
| 55-144500 | 11/1980 | Japan | 156/DIG. 64 |

OTHER PUBLICATIONS

Minagwa et al, "Epitaxial Growth of α-SiC from the Vapor Phase" Japanese Journal of Applied Physics, vol. 10, No. 12 (Dec. 1971) pp. 1680-1690.

*Primary Examiner*—Robert Kunemund
*Attorney, Agent, or Firm*—Oblon, Spivak, McClelland, Maier & Neustadt

[57] ABSTRACT

The susceptor according to the present invention comprises a main body in the shape of a trapezoidal plate, and which has three circular depressions formed in its surface. The main body is made of silicon carbide having a bulk density of 3.00 g/cm³ or more. At least 70% of the surface region of the main body is made of crystal particles having a diameter of 5 μm or more. The main body has a thickness of, for example, 700 μm. Six susceptors are attached to a hexagonal upper plate which is fastened to a shaft, and also to a hexagonal lower plate, thereby forming a barrel. Silicon wafers are placed in the circular depressions, so that single-crystal layers may be epitaxially formed on the wafers.

3 Claims, 3 Drawing Sheets

SUSCEPTOR FOR VAPOR-GROWTH DEPOSITION

This is a Continuation of application Ser. No. 07/551,646, filed on Jul. 9, 1990, now abandoned which is a continuation of Ser. No. 07/232,553, filed Aug. 15, 1988 now abandoned, which is a Continuation-in-part of Ser. No. 07/013,432, filed Feb. 11, 1987 which is now abandoned.

BACKGROUND OF THE INVENTION

This invention relates to a susceptor for supporting semiconductor substrates while layers are being epitaxially grown thereon, by using, for example, heat radiating from lamps.

Epitaxial growth, which is a step in the manufacturing of a semiconductor, is carried out in the following manner:

First, silicon wafers are supported on a susceptor. The susceptor is then inserted into a reaction vessel. Thereafter, a reaction gas is introduced into the vessel. A halogen lamp provided within the chamber is turned on. The lamp heats up the atmosphere in the chamber, whereby a single-crystal silicon layer is formed on the wafer, by vapor-phase growth.

The susceptor conventionally used in the epitaxial growth step is comprised of a substrate of isotropic graphite with a layer of silicon carbide formed thereon. The silicon carbide layer has been previously formed by CVD (chemical vapor deposition), and has a thickness of about 60 to 100 μm. This layer prevents an impurity from diffusing from the graphite substrate into the wafers during the vapor-phase growth step, and also protects the substrate from wear.

Graphite, the material constituting the substrate (i.e., the main component of the susceptor), is porous, and has a low mechanical strength as well as low thermal conductivity. The substrate must therefore be made thick enough to have sufficient mechanical strength. The resulting susceptor is inevitably heavy and less easy to handle. Further, its calorific capacity is large, which reduces the energy efficiency of the susceptor, in the vapor-phase growth of single-crystal silicon.

The conventional susceptor has a further drawback. During the vapor-phase growth of single-crystal silicon, the reaction gas attacks the carbide layer, forming pinholes in the thin portions of the layer. The impurities contained in the graphite substrate diffuse through these pinholes into the wafers mounted on the susceptor. Consequently, the yield of semiconductor devices formed on the wafers will be reduced.

Graphite, the material forming the substrate, has a thermal expansion coefficient substantially the same as that of silicon carbide. If this were not so, the silicon carbide layer would peel off the graphite substrate, because the susceptor is repeatedly heated and cooled during the vapor-phase growth of single-crystal silicon layers on the wafers. Nonetheless, the susceptor, which is composed of two different materials, does not have adequate resistance to thermal shock. In the worst case, the susceptor will break while it is being repeatedly heated and cooled in the vapor-phase growth step.

SUMMARY OF THE INVENTION

Accordingly, the object of the present invention is to provide a susceptor for supporting wafers during the epitaxial growing of layers on these wafers, and which can prevent impurities from diffusing into the wafers, which can be handled with ease, can maintain a high energy-efficiency in the process of epitaxial growth, which is mechanically strong and resistant to thermal shock, and has a long lifetime.

An susceptor according to the present invention comprises a main body in the form of a plate. The main body is made of silicon carbide having a bulk density of 3.00 g/cm$^3$ or more. At least (70%) of its surface region is formed of crystal particles having a diameter of 5 μm or more.

Since the main body is made of silicon carbide having a bulk density of 3.00 g/cm$^3$ or more, it not only is mechanically strong but also has good thermal conductivity. Hence, the susceptor can be made sufficiently thin and light to ensure ease of handling. The susceptor can have a small calorific capacity, and can help to raise the energy-efficiency in the vapor-phase growth of single-crystal silicon. Further, the susceptor is resistant to reaction gas, since at least 70% of the surface region of the main body is formed of crystal particles having a diameter of 5 μm or more. This layer can prevent impurities, if any, from the main body from diffusing into the wafers during the vapor-phase growth step. Still further, the susceptor is resistant to thermal shock, since the main body is made of silicon carbide. Preferably, the susceptor has a thickness of about 200 to 3000 μm.

DETAILED DESCRIPTION OF THE PREFERRED EMBODIMENT

Figure 1:
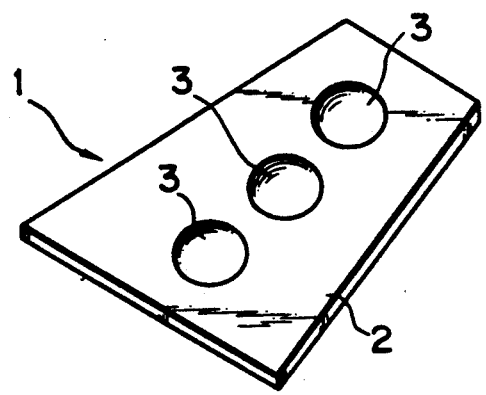
FIG. 1 is a perspective view of a susceptor according to the present invention.

One embodiment of the present invention will now be described, with reference to the accompanying drawings. As is shown in FIG. 1, susceptor 1 according to the present invention comprises main body 2. Main body 2 is a trapezoidal plate and has three circular depressions 3 formed in its surface. Main body 2 is made of silicon carbide. The bulk density of body 2 is preferably 3.00 g/cm$^3$ or more. It is preferred that at least 70% of the surface region of main body 2 is made of crystal particles having a diameter of 5 μm or more. Body 2 should desirably consist of first and second SiC layers. The second SiC layer should preferably have a thickness of 120 μm or less, more preferably, 50 μm or less. Further, the average crystal particle size of the second SiC layer should preferably be 50% or less, more preferably, 33% or less, of that of the first SiC layer. Main body 2 has a thickness of, for example, 700 μm. Each depression 3 has a concave surface curving along an arc having a radius of 10 m. Where body 2 is of two-layer structure as noted above, a recess is formed on the surface of the second SiC layer for support of a wafer.

Figure 2:
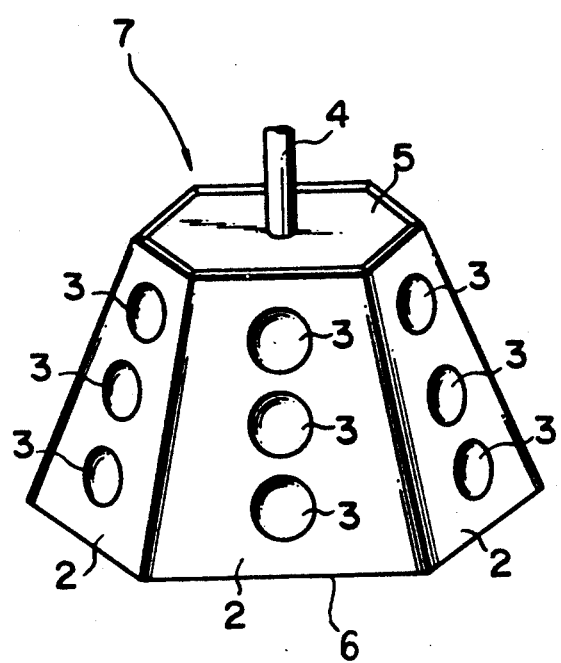
FIG. 2 is a perspective view of a barrel-shaped structure composed of susceptors identical to the susceptor shown in FIG. 1.

As is shown in FIG. 2, six susceptors identical to the one shown in FIG. 1 are attached to hexagonal upper plate 5 fastened to shaft 4, and also to hexagonal lower plate 6, thereby forming barrel 7. Silicon wafers 10 are placed in circular depressions 3, and barrel 7 is inserted into epitaxial-growth vessel 20 shown in FIG. 3, so that single-crystal layers may be epitaxially formed on wafers 10.

Figure 3:
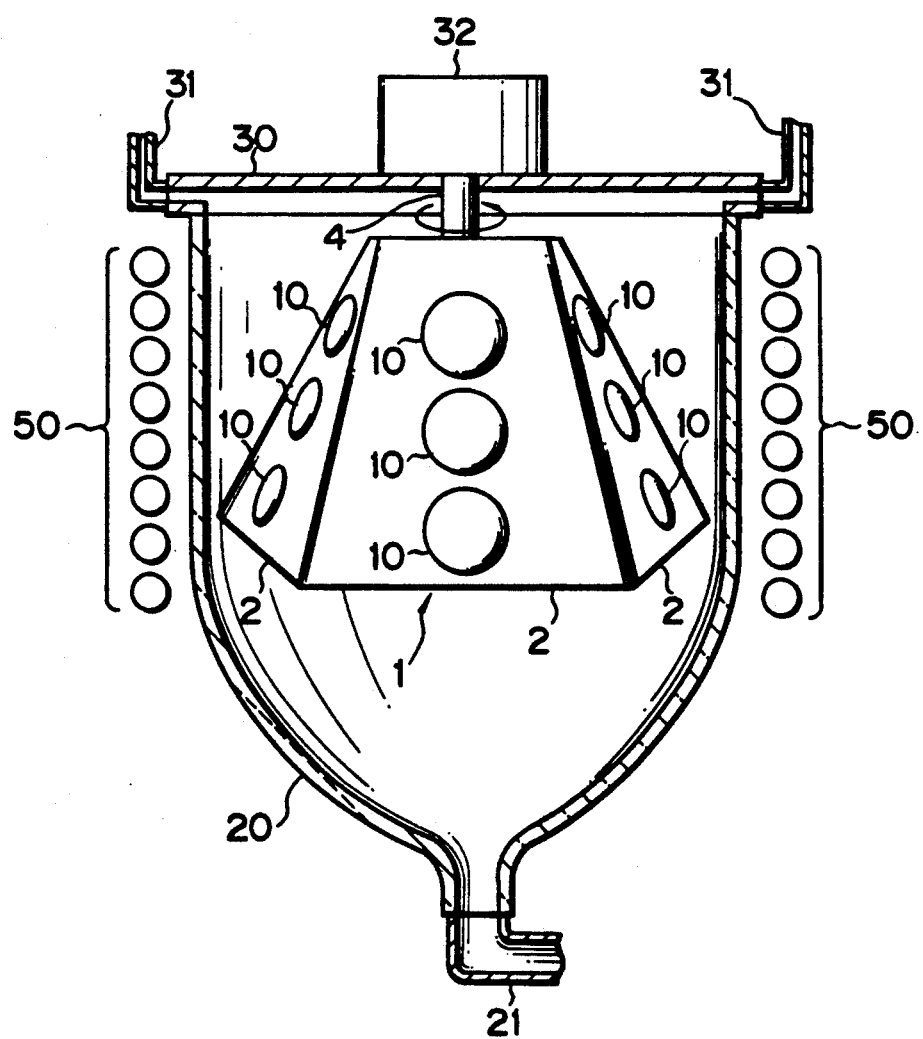
FIG. 3 is a cross-sectional view of a vapor-growth vessel containing the structure of FIG. 2.

Vessel 20 is made of transparent quartz glass. As is shown in FIG. 3, vessel 20 has an open top, and outlet port 21 in its bottom. Barrel 7 is inserted in vessel 20, with shaft 4 extending upward. The open top of vessel 20 is then closed by cover 30. Cover 30 has a center hole, and two inlet ports 31 in its edge portion. Motor 32 is provided on cover 30. Shaft 4 extends through the center hole of cover 30, and is coupled to the shaft of motor 32. Hence, motor 32 can rotate barrel 7. Halogen lamps 50 are provided around vessel 20, to heat and thereby raise the internal temperature thereof.

In order to grow single-crystal silicon on wafers 10 mounted on barrel 7, barrel 7 is rotated at a constant speed. Then, a reaction gas, for example, tetrachloro silane, is supplied into vessel 20, through inlet ports 31, while at the same time, the air contained in vessel 20 is being evacuated through outlet port 21. Next, vessel 20 is heated by halogen lamps 50, thereby raising the internal temperature thereof to 1200° to 1300° C. The reaction gas is decomposed, forming single-crystal silicon on wafers 10.

Figure 4:
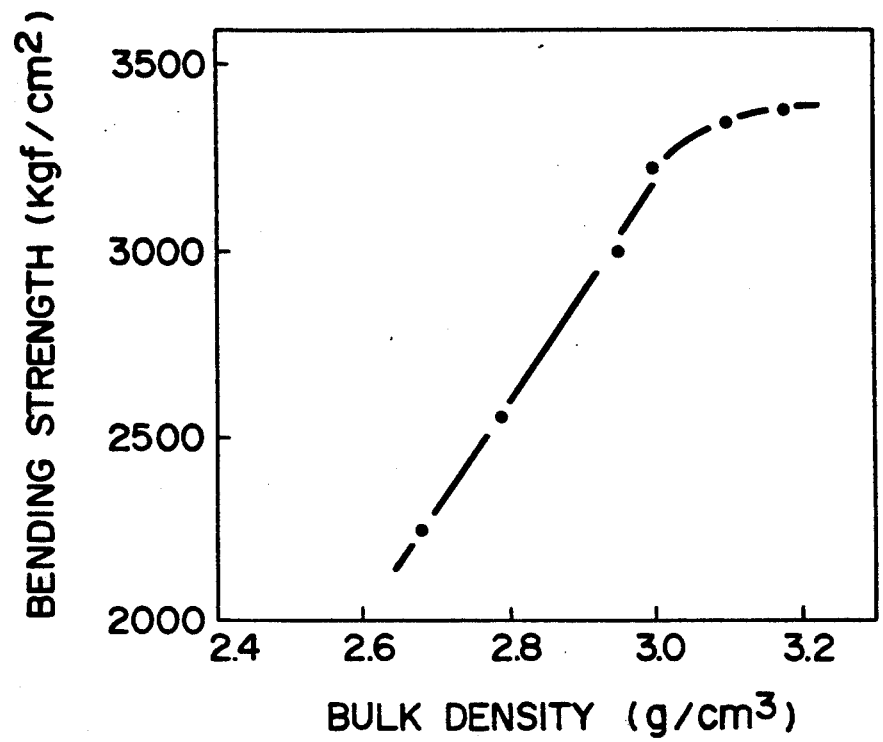
FIG. 4 is a graph illustrating the relationship between the bulk density and bending strength of the main body of the susceptor shown in FIG. 1.

Main body 2 of silicon carbide is formed by the CVD method, which will later be described in detail. The silicon carbide preferably has a bulk density of at least 3.00 g/cm$^3$ as described above. Otherwise, the material is neither sufficiently strong, nor sufficiently resistant to hydrogen chloride which is used for etching. FIG. 4 shows the relationship between the bulk density and bending strength of silicon carbide formed by the CVD method. As is evident from FIG. 4, any silicon carbide having a bulk density of 3.00 g/cm$^3$ or more can have a bending strength of 3000 kgf/cm$^2$ or more. By contrast, as can also be understood from FIG. 4, any silicon carbide whose bulk density is less than 3.00 g/cm$^3$ has much less bending strength.

The thinner the the surface region of main body 2, formed of crystal particles, the lower the bending strength thereof. Further, the smaller the crystal particles, the lower the resistance to the gas resulting from the gas-reaction occurring within vessel 20. An experiment has been conducted in which hydrogen chloride gas was applied for 60 minutes, at 1200° C., 1250° C., and 1300° C., to silicon carbide layers whose crystal particle sizes were 2 μm, 5 μm, and 10 μm. The results of this experiment are shown in Table 1.

TABLE 1

| | Temp. (°C.) | Size of Crystal Particles (μm) | | |
|---|---|---|---|---|
| | | 2 | 5 | 10 |
| A | 1200 | x | o | o |
| B | 1250 | xx | o | o |
| C | 1300 | xxx | x | o |

Referring to Table 1, mark "o" indicates that the layer was not attacked by hydrogen chloride gas, mark "x" shows that the layer was slightly corroded by the gas, mark "xx" means that the layer was corroded by the gas over about half its surface area, and mark "xxx" indicates that the layer was corroded by the gas over almost all its surface area. As Table 1 shows, the layers made of silicon carbide whose crystal particle size is 2 μm were severely corroded by hydrogen chloride gas. As can be clearly understood from Table 1, the layers made of silicon carbide whose crystal particle size is 5 μm or more were sufficiently resistant to attack by hydrogen chloride gas. In particular, the layers made of silicon carbide whose crystal particle size is 10 μm were not corroded at all, in the course of the experiment. Hence, it can be said that the greater that portion of the surface region of body 2 which is formed of crystal having a particle size of at least 5 μm, the more resistant is the main body to attack by hydrogen chloride gas.

Also, the greater that portion of the surface region of body 2 which is formed of crystal having a particle size of 5 μm or more, the greater the bending strength of main body 2. When 70% or more of the surface region of main body 2 is made of this crystal, body 2 can have a bending strength of at least 3000 kg/cm$^2$. When less than 70% of the surface region is made of this crystal, main body 2 will have a bending strength considerably lower than this figure. Further, body 2 can be sufficiently resistant to hydrogen chloride when at least 70% of its surface region is formed of crystal particles whose diameter is 5 μm or more.

For the reasons stated above, 70% or more of the surface region of main body 2 is formed of crystal particles whose size is 5 μm or more.

It is desirable for the surface of body 2, on which a wafer is disposed, to have a roughness of 12.5 μm in terms of Ra (JIS B0651).

It is preferably that main body 2 have a thickness of 200 to 3000 μm. When its thickness is less than 200 μm, body 2 possesses inadequate mechanical strength, and cannot be uniformly heated by halogen lamps 50. On the other hand, when the thickness is greater than 3000 μm, body 2 has such a high calorific capacity that it would require an inordinate amount of time to heat thoroughly or to cool. Further, when body 2 has a thickness over 3000 μm, it will contain residual stress, and will therefore eventually break if it is heated or cooled too quickly. More preferably, the thickness of body 2 should fall within the range of 200 to 2500 μm. A still more preferable range would be 300 to 2000 μm, for the following reasons:

First, when the thickness is 2000 μm or less, the energy-saving property of body 2 is markedly high, and the manufacturing cost is low.

Secondly, when the thickness is over 2500 μm, the energy-saving property is low, and the manufacturing cost is high.

Thirdly, when the thickness is less than 300 μm, body 1 is too thin to handle with ease.

Where body 2 is of two-layer structure, the average crystal particle size of the second SiC layer should preferably by 50% or less, more preferably, 33% or less, of that of the first SiC layer, as described previously. If the average crystal particle size falls within the range defined herein, the susceptor is enabled to exhibit marked improvements in the resistance to load and in the mechanical strength. The average crystal particle diameter of the second SiC layer should preferably be 60 μm or less, more preferably, 40 μm or less in order to suppress the adverse effect on the wafer and to improve the mechanical strength of the susceptor. The average crystal particle diameter of the first SiC layer should preferably be 120 μm or less.

As described previously, the second SiC layer should preferably have a thickness of 120 μm or less. If the second SiC layer is thicker than 120 µm, the wafer tends to incur thermal damage in the step of heat treatment of the wafer, with the result that the wafer is likely to bear crystal defects. Also, the second SiC layer thicker than 120 µm makes it difficult to achieve a high dimensional accuracy in the processing of the susceptor, particularly, the facing for supporting a wafer. Further, the second SiC layer, thicker than 120 µm, tends to cause the susceptor to have an insufficient bending strength. More preferably, the second SiC layer should have a thickness of 50 µm or less.

It is desirable for the second SiC layer surface, on which a wafer is disposed, to have a roughness of 12.5 µm in terms of Ra (JIS B0651). It is also desirable for the first SiC layer to be thicker than the second SiC layer.

A method of manufacturing the susceptor according to the present invention will now be explained.

First, an isotropic graphite substrate, which has been treated to have a thermal expansion coefficient substantially equal to that of silicon carbide, is placed within a CVD furnace. Next, the temperature in the furnace is raised to, for example, 1500° C. Then, trimethylchlorosilane (TMCS) gas and hydrogen gas are supplied into the furnace, in a flow ratio of, for example, 1:50. The gases are allowed to react for a prescribed period of time. As a result, a silicon carbide layer of a prescribed thickness is formed on the substrate. Thereafter, the substrate is inserted in another furnace having an oxidizing atmosphere. Then, the temperature inside the furnace is raised to 800° C., thereby oxidizing the graphite substrate and removing it from the silicon carbide layer. Some portions of that surface region of the carbide layer, facing away from the substrate, are formed of crystal particles whose size is 5 µm or more. The ratio of the area occupied by these portions to the total surface area (hereinafter called "crystal ratio") varies, depending upon the flow rate of the reaction gas and also upon the reaction time. When TMCS gas and hydrogen gas are used in the ratio of 1:50, as mentioned above, and the flow rate of the reaction gas is 70 l/min, the crystal ratio can be 70% or more, provided that the reaction time is at least 20 hours.

That surface region of the silicon carbide layer, in direct contact with the graphite substrate, is formed of extremely fine particles of crystalline and amorphous carbon carbide. These fine particles are neither resistant to corrosion nor mechanically strong. Hence, re-coating is performed on this surface region under the same CVD conditions. That is, the silicon carbide layer is placed inside the CVD furnace, and the temperature therein is raised to, for example, 1500° C. Then, TMCS gas and hydrogen gas are supplied into the furnace, in a flow ratio of, for example, 1:50. The gases are allowed to react, whereby a re-coating layer of silicon carbide is formed, and which is sufficiently resistant to corrosion.

An experiment has been conducted in which the recoating was performed using various flow rates for the reaction gas. The re-coated silicon carbide layers had re-coating layers of various thicknesses, different crystal ratios, various bending strengths, and different surface roughnesses, as is shown in Table 2.

TABLE 2

| | Flow Rate (l/min) | Layer Thickness (µm) | Crystal Ratio (%) | Bending Strength (kgf/cm²) | Surface Roughness (µm) |
|---|---|---|---|---|---|
| A | 300 | 525 | 0 | 1500 | 14.3 |

TABLE 2-continued

| | Flow Rate (l/min) | Layer Thickness (µm) | Crystal Ratio (%) | Bending Strength (kgf/cm²) | Surface Roughness (µm) |
|---|---|---|---|---|---|
| B | 100 | 510 | 50 | 2300 | 12.5 |
| C | 80 | 530 | 70 | 3100 | 10.0 |
| D | 70 | 505 | 90 | 3150 | 10.5 |

All the samples, i.e. silicon carbide layers, had been obtained by primary coating performed for 20 hours, and exhibited a crystal ratio of 70%. The bending strength was measured by 3-point bending test. That is, each layer was held at two points set apart 40 mm, and a bending force was applied to the primary-coated surface of the layer. The surface roughness was measured by a tracer-type meter defined in JIS, B0561.

As is evident from Table 2, samples A and B exhibited a crystal ratio of 50% or less, an insufficient bending strength, and a comparatively rough surface. In contrast, samples C and D, which had been re-coated with a low flow rate silicon carbide layer, exhibited a crystal ratio of 70% or more, resulting in a bending strength of 3000 kgf/cm² or more. Samples C and D had a comparatively smooth surface, and it can therefore be said with confidence that when a silicon carbide layer one of whose surface regions has a crystal ratio of 70% or more is used to support wafers, the wafers mounted on this surface will not be scratched.

Main body 2 of susceptor 1 can have a crystal ratio of 70% or more on all surfaces, only if boy 2 is recoated under such appropriate conditions as have been described above. Therefore, main body 2 can have sufficiently smooth surfaces and sufficient bending strength.

Main body 2 made of the silicon carbide thus prepared has a bulk density of 3.00 g/cm³ or more when its crystal ratio is over 70%. This bulk density can be made to be nearly equal to a theoretical value of 3.21 g/cm³ if the required condition are satisfied. This means that the permeability of main body 2 can be reduced to substantially zero.

Figure 5:
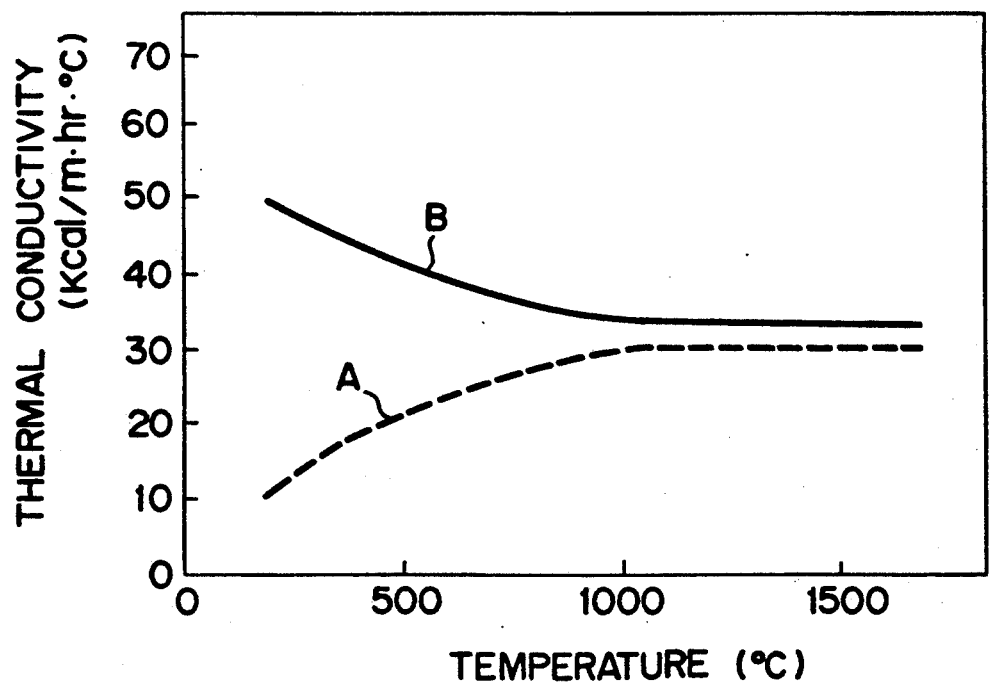
FIG. 5 is a graph explaining the relationship between the temperature inside the vessel and the thermal conductivity of silicon carbide layers, one of which has been re-coated, and the other of which has not.

The re-coating of the silicon carbide layer results in the following advantages:

An experiment was carried out in which some of silicon carbide layers obtained by the primary coating were re-coated to have a surface region having a crystal ratio of 70% or more, whereas the others of these layers were not re-coated. The thermal diffusivity and thermal conductivity of the surface region of each silicon carbide layer were measured. The surface regions A of the samples which had not been re-coated had an average thermal diffusivity of 0.53 cm²/sec. The surface-regions of the other samples, which had been re-coated, had an average thermal diffusivity of 0.75 cm²/sec. FIG. 5 shows the relation between the thermal conductivity of the surface region of each sample and the temperature of the sample. As is evident from FIG. 5, surface regions B have a higher thermal conductivity than surface regions A, in particular, in the low-temperature range. Since the heat applied from halogen lamps 50 can diffuse more quickly through surface region B, and into the portion of susceptor 1, than through surface region A, a sample having surface region B thereon can be endowed with greater energy-saving properties.

Moreover, when the silicon carbide layer is re-coated, any impurities which may have remained on the layer, before the re-coating, will be sealed under the re-coating layer. This is the first advantage to be derived from the re-coating of the silicon carbide layer. Hence, such impurities are prevented from diffusing through the re-coated surface region and into main body 2. This is the second advantage accruing from the re-coating of the silicon carbide layer.

Susceptor 1 produced by the method described above is a one-piece member. It does not possess the drawback inherent in the conventional composite susceptor, wherein the silicon carbide layer may possibly peel off the graphite substrate, during the vapor-phase growth step.

It is possible to control the thickness of the silicon carbide layers while maintaining the crystal ratio at a value of 70% or more, by changing the flow rate of the reaction gas, the temperature within vessel 20, and the reaction time.

The susceptor manufactured as above is of two-layer structure consisting of a SiC layer formed in direct contact with the substrate, i.e., a first SiC layer, and a re-coating SiC layer, i.e., a second SiC layer, formed on the first SiC layer.

The thicknesses of the first and second SiC layers can be controlled by changing the reaction times in the steps of forming these layers, as seen from table 3 below. Specifically, Table 3 shows changes in the average thickness and the average crystal particle size of each of these SiC layers, resistance to load of the susceptor, surface roughness of the second SiC layer, and the crystal diameter ratio, with respect to the change in the reaction time for forming each of these SiC layers. The reacting conditions including the reaction temperature employed in the experiments for obtaining the data given in Table 3 were equal to those in Table 2.

As apparent from Table 3, the susceptor exhibits a markedly improved load resistance in the case where the crystal particle diameter ratio, i.e., A/B×100, where A and B represent the average crystal particle diameters of the second and first SiC layers, respectively, is 50% or less. The improvement is particularly prominent where the ratio noted above is 33% or less. It should also be noted that, if the second SiC layer is thicker than 120 μm, the surface roughness is increased and the bending strength is lowered.

The three-point bending strength Bst determined by three-point bending test is defined as follows:

$$Bst = (3/2 \times W \times l)/(W \times t^2)$$

where, W is load at break, l is span length, t is sample thickness, and w is sample width.

Thus, $l \times Bst \times t^2 = (w \times l)/w$

In terms of logarithm;

$$2 \log t + \log (Bst \times l) = \log (W \times l/w)$$

Since the value of Bst is constant in the case of a uniform material, log (Bst × l) may be set at k, i.e., log (Bst × l) = k. In this case, log (W × l/w) = 2 log t The load resistance, which is represented by W × l/w, is proportional to the square of the sample thickness. It follows that the load resistance is increased with increase in the thickness of the susceptor. However, the bending strength is lowered if the thickness of the second SiC layer exceeds 120 μm.

TABLE 3

| No. | Reaction time for 1st SiC layer (hrs) | Ave. thickness of 1st SiC layer (μm) | Ave. crystal particle diameter for 1st SiC layer (μm) | Reaction time for 2nd SiC layer (hrs) | Ave. thickness of 2nd SiC layer (μm) | Ave. crystal particle diameter for 2nd SiC layer (μm) | Load resistance (gw) *1 | Surface roughness of 2nd SiC layer (μm) *2 | Crystal diameter ratio (%) *3 |
|---|---|---|---|---|---|---|---|---|---|
| 1 | 10 | 100 | 55 | 3.5 | 30 | 30 | 700 | 7.5 | 55 |
| 2 | 20 | 200 | 70 | 3.5 | 30 | 30 | 2100 | 7.5 | 43 |
| 3 | 40 | 400 | 105 | 3.5 | 30 | 30 | 6500 | 7.5 | 29 |
| 4 | 50 | 500 | 120 | 3.5 | 30 | 30 | 9300 | 7.5 | 25 |
| 5 | 10 | 100 | 55 | 5.0 | 50 | 40 | 920 | 9.0 | 73 |
| 6 | 20 | 200 | 70 | 5.0 | 50 | 40 | 3400 | 9.0 | 57 |
| 7 | 40 | 400 | 105 | 5.0 | 50 | 40 | 7100 | 9.0 | 38 |
| 8 | 50 | 500 | 120 | 5.0 | 50 | 40 | 10000 | 9.0 | 33 |
| 9 | 10 | 100 | 55 | 12.0 | 120 | 60 | 1900 | 12.5 | 109 |
| 10 | 20 | 200 | 70 | 12.0 | 120 | 60 | 3600 | 12.5 | 86 |
| 11 | 40 | 400 | 105 | 12.0 | 120 | 60 | 9000 | 12.5 | 57 |
| 12 | 50 | 500 | 120 | 12.0 | 120 | 60 | 12000 | 12.5 | 50 |
| 13 | 10 | 100 | 55 | 15.0 | 150 | 65 | 3400 | 13.6 | 118 |
| 14 | 20 | 200 | 70 | 15.0 | 150 | 65 | 4500 | 13.6 | 93 |
| 15 | 40 | 400 | 105 | 15.0 | 150 | 65 | 10000 | 13.6 | 62 |
| 16 | 50 | 500 | 120 | 15.0 | 150 | 65 | 14000 | 13.6 | 54 |

*1 Value in the sum of 1st and 2nd SiC layers, which is given by (span length × load)/layer width a bending test.
*2 Ra (JIS B0651)
*3 A/B × 100, where A represents the average crystal particle diameter for 2nd SiC layer, with B representing the average crystal particle diameter for 1st SiC layer An example of the susceptor according to the present invention will now be described.

Substrates having the shape shown in FIG. 1 were made. The substrates were made of isotropic graphite which had been treated to have a thermal expansion coefficient substantially equal to that of silicon carbide. The substrates were placed within a CVD furnace. Then, the temperature within the furnace was raised to 1500° C., and TMCS gas and hydrogen gas were supplied thereinto, in a flow ratio of 1:50. The gases were allowed to react for 50 hours. The temperature inside the CVD furnace was maintained at 1500° C. throughout the reaction period. The substrates were then removed from the furnace. A silicon carbide layer having a thickness of 500 μm had formed on the upper surface of each graphite substrate. Thereafter, the substrates were inserted into an oxidation furnace, and were oxidized at 800° C. As a result, the graphite substrates were removed from the respective silicon carbide layers. The silicon carbide layers were once again inserted into the CVD furnace, each layer being placed therein such that the surface which had been in contact with the subtrate before the substrate was removed, was turned upward. Then, TMCS gas and hydrogen gas were supplied into the CVD furnace, and were allowed to react under the same conditions as described above. It was found that a new silicon carbide layer was formed on that surface of each silicon carbide layer previously in contact with the graphite substrate, thus providing a susceptor having a thickness of 700 μm and shaped as is shown in FIG. 1. These susceptors had a bulk density ranging from 3.16 to 3.19 g/cm$^3$.

Six susceptors thus obtained were assembled onto a barrel such as is illustrated in FIG. 2. The barrel was used repeatedly for the epitaxial growing of single-crystal layers on semiconductor wafers. No problems occurred, even after the barrel had been used 500 times. In contrast, the barrel made of six conventional susceptors could no longer be used after it had been used 215 times, since pinholes had formed in the susceptors. No impurities were found to have diffused from the susceptors of the present invention and into the semiconductor wafers. Furthermore, the susceptors of the present invention were able to raise the energy-efficiency of the vapor-phase growth of single-crystal silicon by a factor of 10% over the conventional susceptors.

What is claimed is:

1. A susceptor in the form of a plate having a thickness of 200 to 300 μm and formed from silicon carbide having a bulk density of 3.00 g/cm$^2$ or more for supporting a substrate on which material is epitaxially grown by vapor growth deposition comprising:
    a body formed of a first layer, the crystal particles of which have an average diameter of 120 μm or less, and a second layer which has a recess portion for supporting said substrate and having a thickness of 120 μm or less, the surface region of the second layer constituted of at least 70 percent crystals having a diameter of 5 μm or less, and the average crystal grain size of the second layer being 60 μm or less and 50 percent or less of that of the first layer.

2. The susceptor of claim 1, wherein said second layer has a thickness of 50 μm or less.

3. The susceptor of claim 1, wherein said second layer is thinner than said first layer.

* * * * *